United States Patent
Margulis

(10) Patent No.: US 9,881,765 B2
(45) Date of Patent: Jan. 30, 2018

(54) METHOD AND SYSTEM FOR SCANNING AN OBJECT

(71) Applicant: APPLIED MATERIALS ISRAEL LTD., Rehovot (IL)

(72) Inventor: Pavel Margulis, Ashdod (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/134,324

(22) Filed: Apr. 20, 2016

(65) Prior Publication Data

US 2017/0309439 A1 Oct. 26, 2017

(51) Int. Cl.
- *H01J 37/147* (2006.01)
- *H01J 37/28* (2006.01)
- *H01J 37/06* (2006.01)

(52) U.S. Cl.
CPC .......... *H01J 37/1474* (2013.01); *H01J 37/06* (2013.01); *H01J 37/28* (2013.01); *H01J 2237/063* (2013.01)

(58) Field of Classification Search
None
See application file for complete search history.

(56) References Cited

U.S. PATENT DOCUMENTS

| | | | | |
|---|---|---|---|---|
| 5,869,833 A * | 2/1999 | Richardson | ............. | H01J 37/28 250/251 |
| 8,207,499 B2 * | 6/2012 | Shoham | ............. | G01N 23/2208 250/306 |
| 8,884,224 B2 * | 11/2014 | Fang | ............. | H01J 37/026 250/306 |
| 2009/0206257 A1 * | 8/2009 | Gunji | ............. | H01J 37/28 250/310 |
| 2013/0126732 A1 * | 5/2013 | Gunji | ............. | H01J 37/1474 250/310 |
| 2015/0200071 A1 * | 7/2015 | Sender | ............. | H01J 37/265 250/307 |
| 2015/0371819 A1 * | 12/2015 | Li | ............. | H01J 37/28 250/310 |
| 2016/0322194 A1 * | 11/2016 | Kooijman | ............. | H01J 37/28 |

FOREIGN PATENT DOCUMENTS

| | | | | |
|---|---|---|---|---|
| JP | 55141056 A | * | 11/1980 | ............. H01J 37/28 |
| JP | 2006066212 A | * | 3/2006 | ............. H01J 37/147 |

* cited by examiner

*Primary Examiner* — Michael Logie
(74) *Attorney, Agent, or Firm* — Kilpatrick Townsend & Stockton LLP

(57) ABSTRACT

A method for scanning an object with a charged particle beam, the method may include repeating, for each pair of scan lines out of multiple pairs of scan lines, the stages of: (i) deflecting the charged particle beam along a first direction, thereby scanning the object along a first scan line of the pair of scan lines; (ii) collecting electrons emitted from the object during the scanning of the object along a majority of the first scan line; (iii) deflecting the charged particle beam along a second direction that is normal to the first direction; (iv) deflecting the charged particle beam along a third direction that is opposite to the first direction, thereby scanning the object along a second scan line of the pair of scan lines; (v) collecting electrons emitted from the object during the scanning of the object along a majority of the second scan line; and (vi) deflecting the charged particle beam along the second direction that is normal to the third direction.

6 Claims, 6 Drawing Sheets

METHOD AND SYSTEM FOR SCANNING AN OBJECT

BACKGROUND

Scanning Electron Microscope (SEM) systems use an electron beam in order to produce an image of the target object. During image formation, an electron beam is moving in a raster manner over the target, high energy primary electrons hit the target and cause emission of secondary electrons, those secondary electrons are collected by electron detector, amplified and processed in order to construct an image of the target.

The primary beam moving over the target (scanning) is usually implemented through application of electrical or magnetic field, which changes in time. Capacitive scanning electrodes and voltage generator are used in SEM systems with electrical scan. Scanning coils and current generator are used in SEM systems with magnetic scan.

One of the main characteristics of a SEM system is its effective data throughput or scan rate. Another important characteristics is linearity of primary beam positioning on the target during the scan line.

FIG. 1 illustrates an ideal X scan signal 20, a X scan signal 30, an ideal Y scan signal 60 and a Y scan signal 50 during a scan of three scan lines of a raster scan.

The X scan signal 30 and the Y scan signal 50 provide a "sawtooth" scan.

In FIG. 1 the x-axis represents time and the y-axis represents either X scan signal intensity or Y scan signal intensity.

X scan signal 30 includes oscillations 31. Oscillations 31 are damped during an X oscillation period Tringing1 13.

Y scan signal 50 includes oscillations 51. Y scan signal 50 has a Y scan signal amplitude B1 71.

FIG. 1 illustrates that raster scanning requires relatively fast changing X scan signal 30 and relatively slowly changing Y scan signal 50.

X scan signal 30 includes scan part 81 and retrace part 82. Scan part 81 has a duration of Tscan1 11. Retrace part 82 has a duration of Tretrace1 15. X scan signal 30 is a periodic signal having a period T1 14.

The resulting SEM image is formed during an actual scan part that has a duration of Tact1 12. Tact1 12 is smaller than Tscan1 11 by Tringing1 13.

During retrace part 82 Y scan signal 50 changes in order to move the primary beam to the next line position. The size of the change is denoted B1 71.

An analysis of X scan signal 30 shows that retrace part 82 is the most challenging part of X scan signal 30 to generate. Retrace part 82 requires the highest slew rate of the X scan signal 30, and therefore, for given X scan signal amplitude A1 41 and scan linearity, the retrace part 82 demands for widest bandwidth of the whole scan system.

The actual data throughput of such scan system is defined by scan duty cycle DC1.

$DC1 = Tact1/Tperiod1$.

$Tact1 = T1 - Tringing1 - Tretrace1$.

Tringing1 depends on X scan signal amplitude A1 41, Tretrace1 13 and a required scan linearity.

Therefore Tact1 depends on required scan linearity and analog performance of the given scan system, like its bandwidth and transient response.

There is a growing need to provide an efficient scanning method.

SUMMARY

According to an embodiment of the invention there may be provided a method for scanning an object with a charged particle beam, the method may include repeating, for each pair of scan lines out of multiple pairs of scan lines, the stages of: (i) deflecting the charged particle beam along a first direction, thereby scanning the object along a first scan line of the pair of scan lines; (ii) collecting electrons emitted from the object during the scanning of the object along a majority of the first scan line; (iii) deflecting the charged particle beam along a second direction that is normal to the first direction; (iv) deflecting the charged particle beam along a third direction that is opposite to the first direction, thereby scanning the object along a second scan line of the pair of scan lines; (v) collecting electrons emitted from the object during the scanning of the object along a majority of the second scan line; and (vi) deflecting the charged particle beam along the second direction that is normal to the third direction.

The method may include ignoring electrons emitted from the object during a first oscillation period that may start at a beginning of the deflecting of the charged particle beam along the first direction.

The method may include ignoring electrons emitted from the object during a second oscillation period that may start at a beginning of the deflecting of the charged particle beam along the third direction.

The majority of the first scan line may exceed ninety percent of the first scan line.

The deflecting of the charged particle beam along the first direction may occur at a first scan rate. The deflecting of the charged particle beam along the third direction may occur at a second scan rate that equals the first scan rate.

The deflecting of the charged particle beam along the first direction may occur at a first scan rate. The deflecting of the charged particle beam along the third direction may occur at a second scan rate that differs from the first scan rate.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
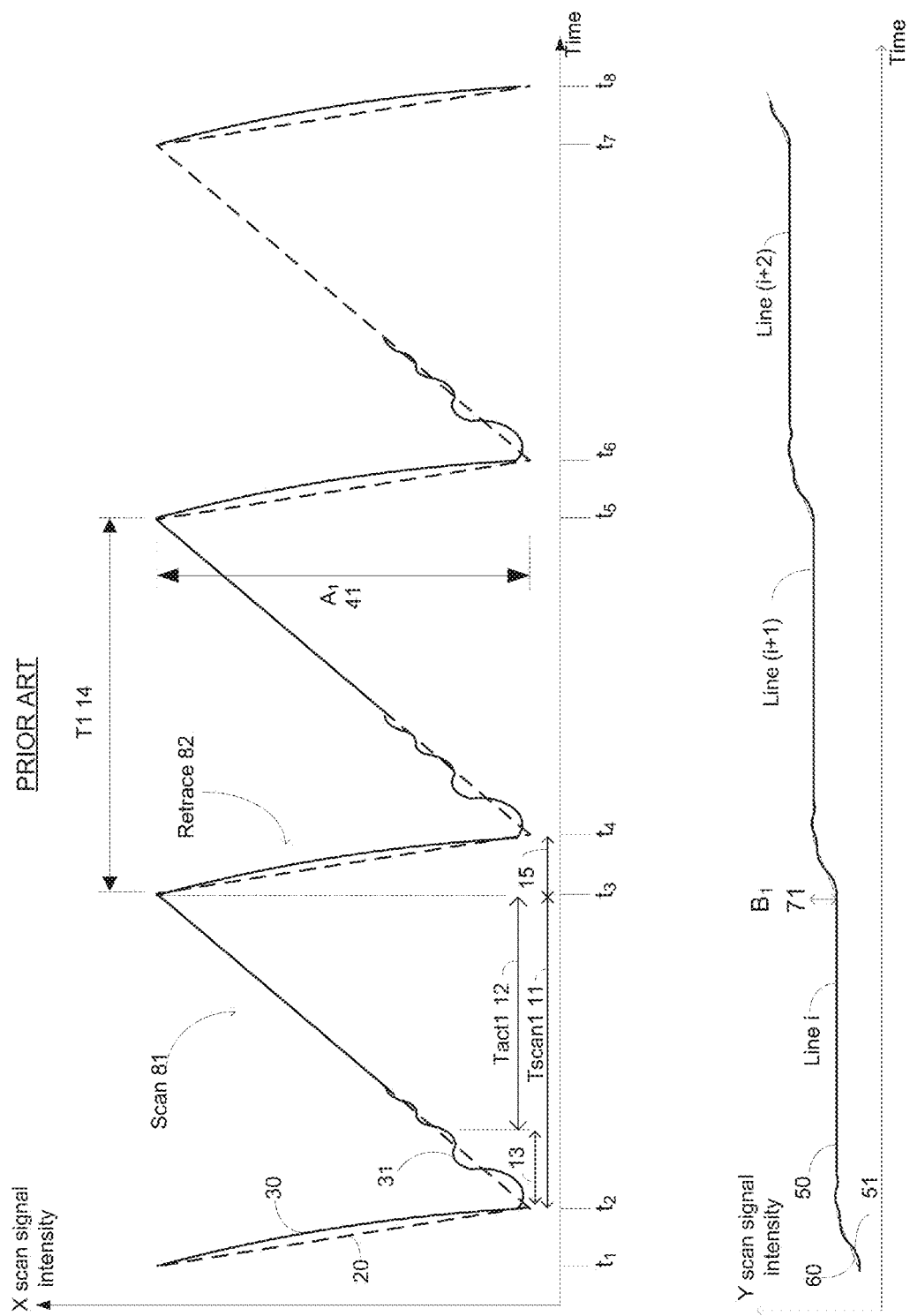
FIG. 1 illustrates various prior art scan signals.

It will be appreciated that for simplicity and clarity of illustration, elements shown in the figures have not necessarily been drawn to scale. For example, the dimensions of some of the elements may be exaggerated relative to other elements for clarity. Further, where considered appropriate,

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Figure 2:
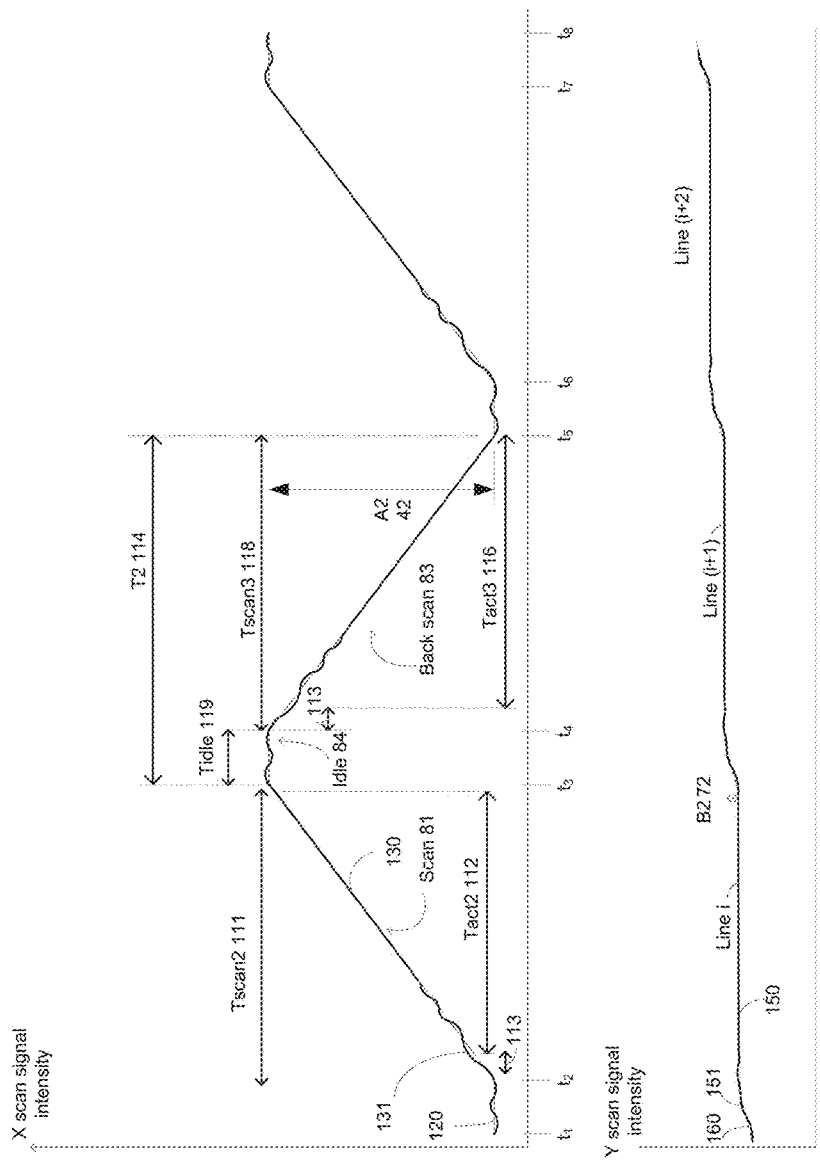
FIG. 2 illustrates various scan signals according to an embodiment of the invention.

FIG. 2 illustrates various scan signals according to an embodiment of the invention. These various scan signals are generated during a so-called "shark tooth" scan.

FIG. 2 illustrates an ideal X scan signal 120, a X scan signal 130, an ideal Y scan signal 160 and a Y scan signal 150 during a scan of three scan lines of a "shark tooth" scan.

In FIG. 2 the x-axis represents time and the y-axis represents either X scan signal intensity of Y scan signal intensity.

X scan signal 130 includes oscillations 131. Oscillations 131 are much smaller than oscillations 31 and are damped during an X oscillation period Tringing2 113. Tringing2 113 is much smaller than prior art X oscillation period Tringing1 13 when generating X scan signal 130 of the same period and amplitude as X scan signal 30 of FIG. 1.

Y scan signal 150 includes oscillations 151.

X scan signal 130 includes scan part 81, idle part 84 and backscan part 83. Backscan part 83 is also followed by an idle part that in turn is followed by scan part 81.

The aggregate duration of backscan part 83 and idle part 84 is denoted T2 114. The aggregate duration of idle part 84 and scan part 81 may equal T2 114.

Scan part 81 has a duration of Tscan2 111.

Idle part 84 has a duration of Tidle 119.

Backscan part 83 has a duration of Tscan3 118.

The resulting SEM image is formed during (i) an actual scan part that has a duration of Tact2 112 and (ii) an actual backscan part that has a duration of Tact 3 116.

Tact2 112 is smaller than Tscan2 111 by Tringing2 113.

Tact3 116 is smaller than Tscan3 118 by Tringing2 113.

The actual data throughput of such scan system is defined by scan duty cycle DC2.

$$DC2=(Tact2+Tact3)/(2*Tperiod2).$$

X scan signal 130 has a X scan signal amplitude A2 42.

Y scan signal 150 has a Y scan signal amplitude B2 72.

It is assumed that A2 42 equals A1 41 and that B1 71 equals B2 72.

The actual scan occurs in both directions, either during scan part 81 (during Tact 2 112) and during backscan part 83 (during Tact3 116).

When applying a "shark tooth" scan there is no retrace any more. Usually, hardware scan drivers for X scan signal and Y scan signals are the same. Therefore, in order to produce relatively small amplitude Y scan signal with given linearity, the Y driver in "shark tooth" scan will need less time than X driver for complete retrace in a prior art "sawtooth" scan. As result, line switch time $(t_2-t_1=t_4-t_3=t_6-t_5)$ may be reduced and scan rate in "sawtooth" scan system may be increased.

For the same slew rate of X scan signal during the scan, the ringing initial amplitude is lower. Therefore, Tact2 112 and Tact3 116 are longer than Tsca1 12. As result scan rate of "shark tooth" scan system is higher.

For a given scan linearity, the slew rate of X scan signal, i.e. scan rate may be significantly increased (scan period decreased).

Alternatively, for given scan rate and data throughput the linearity may be significantly improved.

Figure 3:
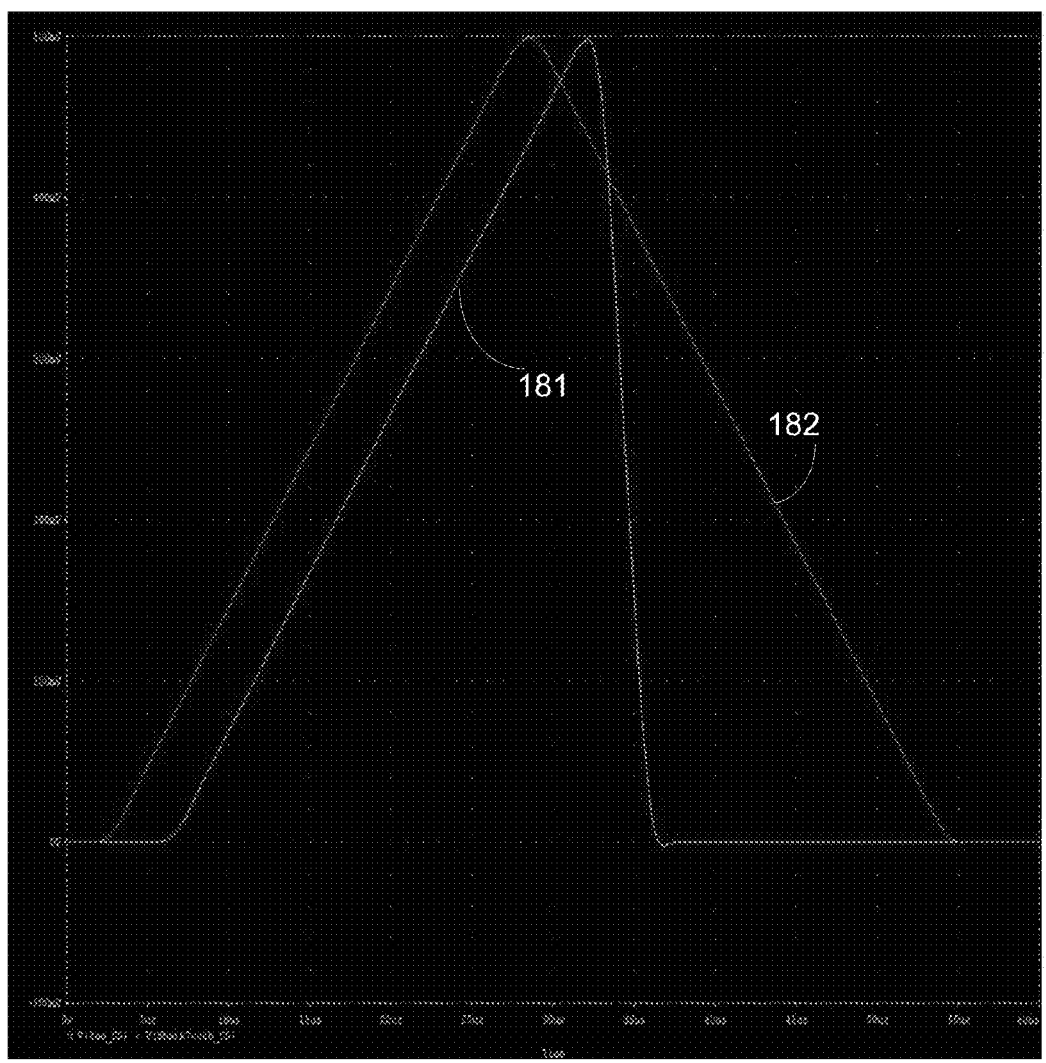
FIG. 3 illustrates a prior art scan signal and a scan signal according to an embodiment of the invention.
Figure 4:
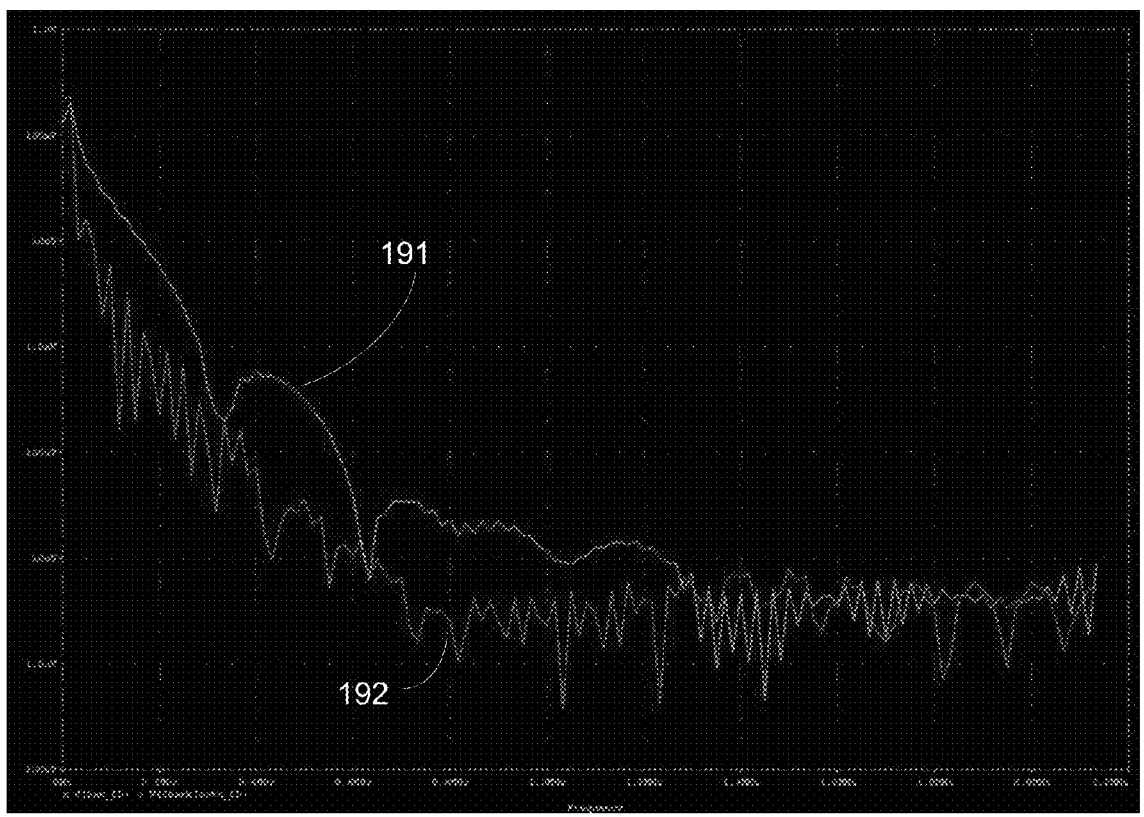
FIG. 4 illustrates a spectral content of a prior art scan signal and a spectral content of a scan signal according to an embodiment of the invention.

FIG. 3 illustrates a prior art X scan signal 181 and an X scan signal 182 according to an embodiment of the invention. FIG. 4 illustrates the prior art X scan signal spectral content 191 and a Xscan signal spectral content 192 according to an embodiment of the invention.

X scan signal 182 has a lower power content at frequencies up to 1.3 MHz than prior art X scan signal 181. Therefore in order to reproduce X scan signal 182, the system may have a scan analog path with bandwidth, which is narrower than for "sawtooth" signal. This benefit may be used in few ways, either to significantly improve linearity or to significantly increase scan rate or to moderately improve both.

Because the fast retrace part does not exist in the "shark tooth" scan, the bandwidth and transient response requirements to scan system analog performance may be significantly relieved or, alternatively, scan period may be significantly reduced (i.e. scan rate increased).

The scan system with given scan period and scan linearity (i.e. analog performance) will provide significantly higher data throughput in "shark tooth" scan than in "sawtooth" scan.

In order to implement a SEM system with a "shark tooth" scan and to minimize scan direction dependent distortions, one has to implement an analog detection channel with symmetrical impulse response.

Figure 5:
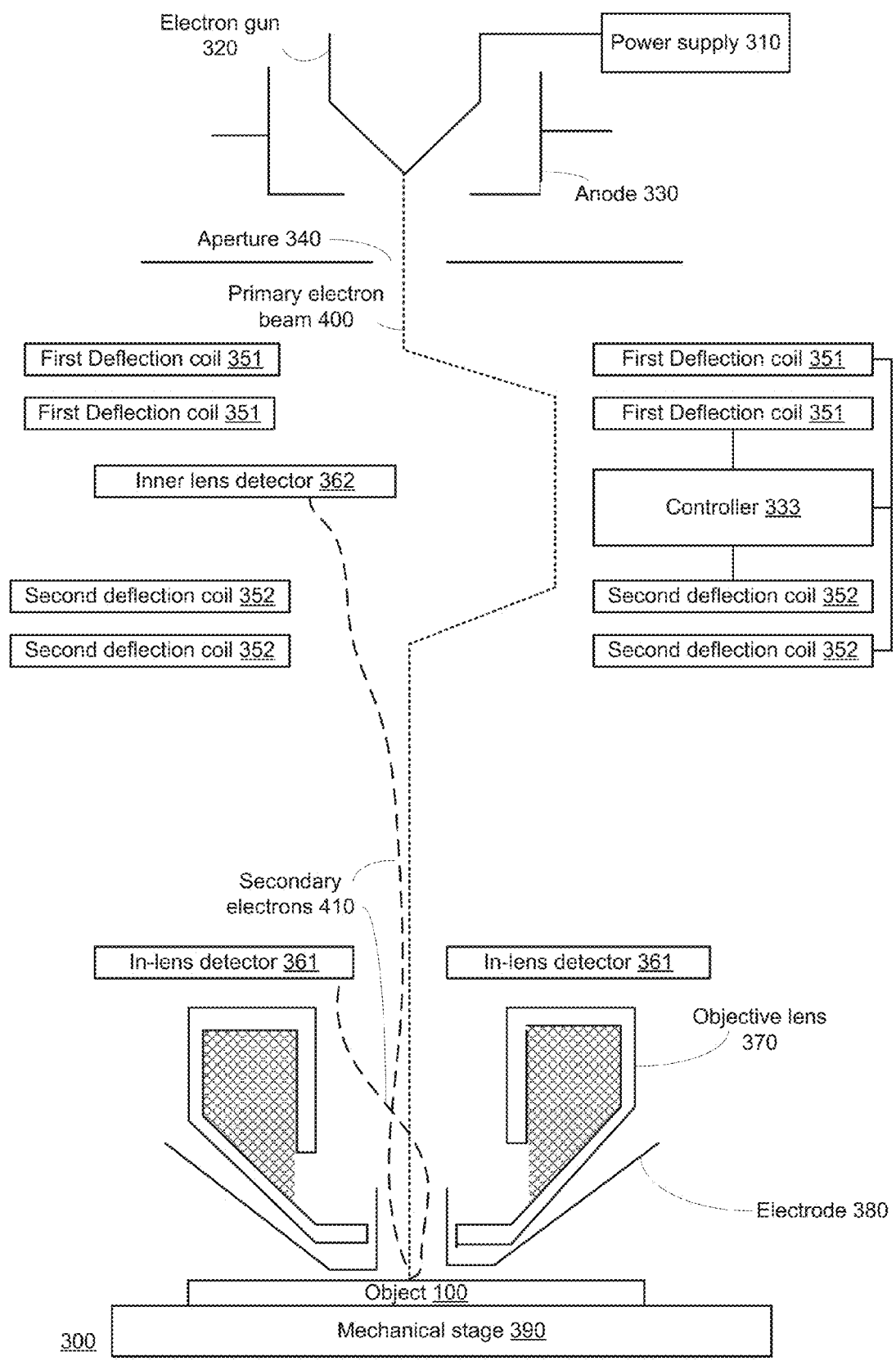
FIG. 5 illustrates a system according to an embodiment of the invention.

FIG. 5 illustrates system 300 and object 100 according to an embodiment of the invention.

System 300 is a SEM and is configured to generate the X scan signal 130 and the Y scan signal 150 of FIG. 2.

System 300 includes power supply 310, inner lens detector 362, anode 330, electron gun 320, aperture 340, first deflection coils 351, second deflection coils 352, in-lens detector 361, objective lens 370, electrode 380 mechanical stage 390 and controller 333.

Power supply 310 feeds electron gun 320.

Electron gun 320 generates primary electron beam 400.

Anode 330 provides an accelerating voltage that forces the primary electron beam 400 to propagate towards object 100. Electrode 380 may provide a decelerating voltage that reduces the energy of electrons of the primary electron beam 400 before the electrons impinge onto object 100.

Primary electron beam 400 passes through aperture 340 and along a first vertical optical axis.

Primary electron beam 400 then passes through a first set of deflection coils. The first set of deflection coils includes four first deflection coils 351. The first set of deflection coils performs two deflections of the primary electron beam—a rightward deflection and then a first counter deflection so that the primary electron beam exits the first set of deflection along a second vertical optical axis that is located to the right of the first vertical optical axis.

Primary electron beam 400 then passes through a second set of deflection coils. The second set of deflection coils includes four second deflection coils 352. The second set of deflection coils performs two deflections of the primary electron beam—a leftward deflection and then a second counter deflection so that the primary electron beam exits the second set of deflection along a third vertical optical axis that may coincide with the first vertical optical axis.

Primary electron beam 400 than passes through an aperture formed in in-lens detector 361 and is focused by objective lens 370 onto object 100. Objective lens 370 may include an electrostatic lens and a magnetic lens that introduce an electrostatic field and a magnetic field.

Secondary electrons emitted from object 100 (as a result of the impingement of the object 100 with primary electron beam 400) are either detected by in-lens detector 361 or propagate through the aperture of the in-lens detector to be deflected by the second set of deflection coils to the left—towards inner lens detector 362.

In addition to the mentioned above deflections, controller 333 controls the first set of deflection coils and the second set of deflection coils to perform a "shark tooth" scan. For example—by providing an X scan signal and a Y scan signal as illustrated in FIG. 2.

Figure 6:
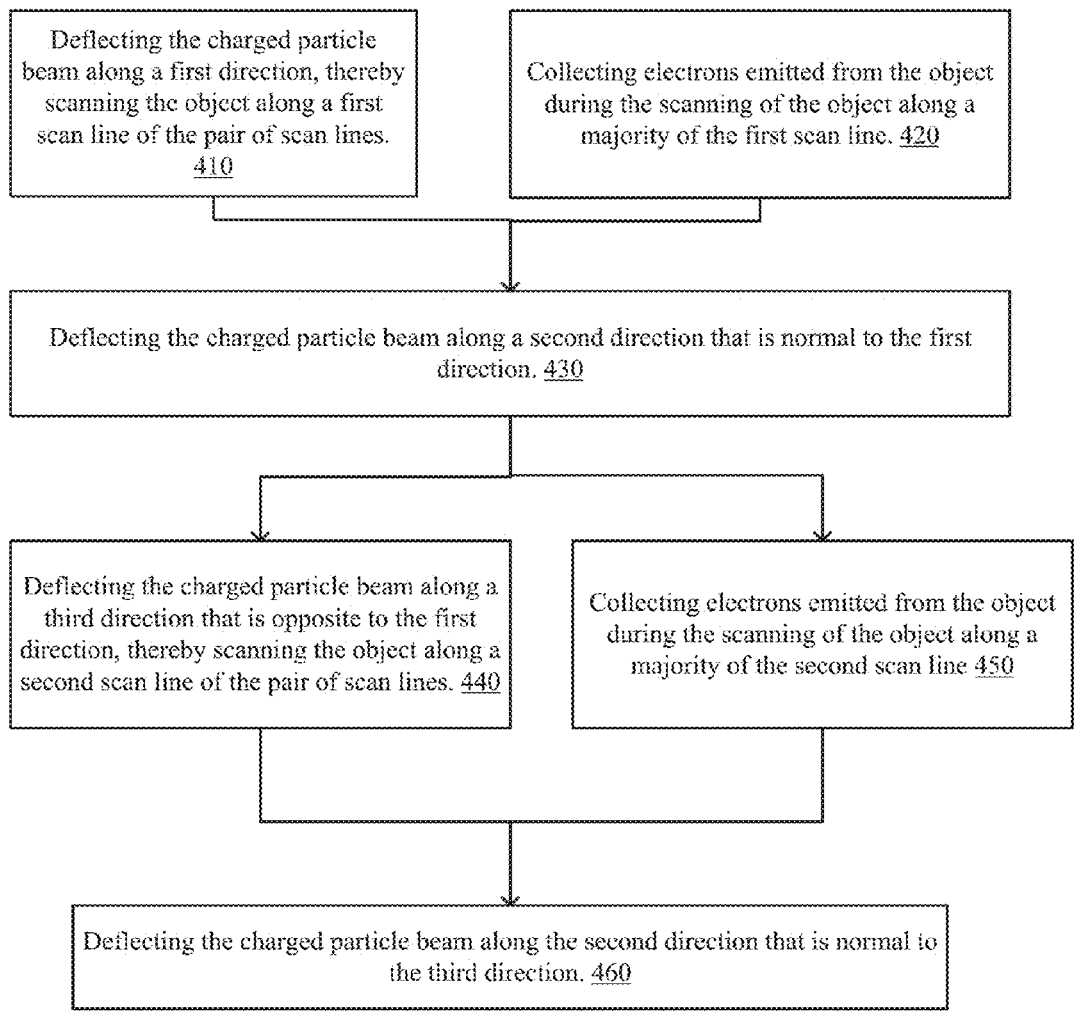
FIG. 6 illustrates a method according to an embodiment of the invention.

FIG. 6 illustrates method 401 according to an embodiment of the invention.

Method 401 may include multiple repetitions of steps 410, 420, 430, 440, 450 and 460. Steps 410, 420, 430, 440, 450 and 460 result in scanning a pair of scan lines. When scanning according to a scan pattern that includes multiple pairs of scan line—steps 410, 420, 430, 440, 450 and 460 should be repeated.

Any repetition starts by steps 410 and 420. Steps 410 and 420 are followed by step 430. Step 430 is followed by steps 440 and 450. Steps 440 and 450 are followed by step 460.

Step 410 may include deflecting the charged particle beam along a first direction, thereby scanning the object along a first scan line of the pair of scan lines.

Step 420 may include collecting electrons emitted from the object during the scanning of the object along a majority of the first scan line. Step 420 may include generating detection signals indicative of the detected electrons.

Step 430 may include deflecting the charged particle beam along a second direction that is normal to the first direction.

Step 440 may include deflecting the charged particle beam along a third direction that is opposite to the first direction, thereby scanning the object along a second scan line of the pair of scan lines.

Step 450 may include collecting electrons emitted from the object during the scanning of the object along a majority of the second scan line. Step 450 may include generating detection signals indicative of the detected electrons.

Step 460 may include deflecting the charged particle beam along the second direction that is normal to the third direction.

Step 420 may include ignoring electrons emitted from the object during a first oscillation period that starts at a beginning of the deflecting of the charged particle beam along the first direction.

Step 440 may include ignoring electrons emitted from the object during a second oscillation period that starts at a beginning of the deflecting of the charged particle beam along the third direction.

The majority of the first scan line may exceed eighty percent, eighty five percent, ninety percent, ninety five percent of the first scan line.

The deflecting of step 410 occurs at a first scan rate. The deflecting of step 430 occurs at a second scan rate. The second scan rate may equal the first scan rate. The second scan rate may differ from the first scan rate.

Detection signals generated during steps 420 and 450 may be processed to provide SEM images.

Although the previous examples referred to a SEM, the invention is applicable to any system that scans an object with a charged particle beam. An example of such a system is an electron beam inspection system.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A method for scanning an object with a charged particle beam, the method comprising:
   repeating, for each pair of scan lines out of multiple pairs of scan lines, the stages of:
      deflecting the charged particle beam along a first direction, thereby scanning the object along a first scan line of the pair of scan lines;
      collecting electrons emitted from the object during the scanning of the object along a majority of the first scan line;
      deflecting the charged particle beam along a second direction that is normal to the first direction;
      deflecting the charged particle beam along a third direction that is opposite to the first direction, thereby scanning the object along a second scan line of the pair of scan lines;
      collecting electrons emitted from the object during the scanning of the object along a majority of the second scan line;
      deflecting the charged particle beam along the second direction that is normal to the third direction; and
      forming an image of the object using detection signals generated during the scanning along the first scan line and the scanning along the second scan line, wherein:
         the image of the object is not formed using detection signals from a first portion of a first oscillation period that starts at a beginning of the deflecting of the charged particle beam along the first direction, wherein a duration of the first portion of the first oscillation period is greater than zero and less than ten percent of a duration of the first scan line;
         the image of the object is formed using detection signals from a second portion of the first oscillation period that extends from an end of the first portion of the first oscillation period to an end of the first oscillation period, wherein a duration of the second portion of the first oscillation period is greater than zero;

the image of the object is formed using detection signals from a non-oscillation period of the first scan line that extends from the end of the first oscillation period to an end of the first scan line, wherein a duration of the second portion of the first oscillation period plus a duration of the non-oscillation period of the first scan line exceeds ninety percent of the duration of the first scan line;

the image of the object is not formed using detection signals from a first portion of a second oscillation period that starts at a beginning of the deflecting of the charged particle beam along the third direction, wherein a duration of the first portion of the second oscillation period is greater than zero and less than ten percent of a duration of the second scan line;

the image of the object is formed using detection signals from a second portion of the second oscillation period that extends from an end of the first portion of the second oscillation period to an end of the second oscillation period, wherein a duration of the second portion of the first oscillation period is greater than zero; and the image of the object is formed using detection signals from a non-oscillation period of the second scan line that extends from the end of the second oscillation period to an end of the second scan line, wherein a duration of the second portion of the second oscillation period plus a duration of the non-oscillation period of the second scan line exceeds ninety percent of the duration of the second scan line.

2. The method according to claim 1 wherein the deflecting of the charged particle beam along the first direction occurs at a first scan rate; and wherein the deflecting of the charged particle beam along the third direction occurs at a second scan rate that equals the first scan rate.

3. The method according to claim 1 wherein the deflecting of the charged particle beam along the first direction occurs at a first scan rate; and wherein the deflecting of the charged particle beam along the third direction occurs at a second scan rate that differs from the first scan rate.

4. A system for scanning an object, comprising:
a charged particle source configured to generate a charged particle beam;
deflection coils configured to deflect the charged particle beam;
an objective lens configured to focus the charged particle beam onto the object;
a detector configured to detect electrons emitted from the object;
a processor configured to form an image of the object using detection signals from the detector; and
a controller configured to scan the object by repeating, for each pair of scan lines out of multiple pairs of scan lines, the stages of:
deflecting the charged particle beam along a first direction, thereby scanning the object along a first scan line of the pair of scan lines;
collecting electrons emitted from the object during the scanning of the object along a majority of the first scan line;
deflecting the charged particle beam along a second direction that is normal to the first direction;
deflecting the charged particle beam along a third direction that is opposite to the first direction, thereby scanning the object along a second scan line of the pair of scan lines;
collecting electrons emitted from the object during the scanning of the object along a majority of the second scan line;
deflecting the charged particle beam along the second direction that is normal to the third direction; and
forming an image of the object using detection signals generated during the scanning along the first scan line and the scanning along the second scan line, wherein:
the image of the object is not formed using detection signals from a first portion of a first oscillation period that starts at a beginning of the deflecting of the charged particle beam along the first direction, wherein a duration of the first portion of the first oscillation period is greater than zero and less than ten percent of a duration of the first scan line;
the image of the object is formed using detection signals from a second portion of the first oscillation period that extends from an end of the first portion of the first oscillation period to an end of the first oscillation period, wherein a duration of the second portion of the first oscillation period is greater than zero;
the image of the object is formed using detection signals from a non-oscillation period of the first scan line that extends from the end of the first oscillation period to an end of the first scan line, wherein a duration of the second portion of the first oscillation period plus a duration of the non-oscillation period of the first scan line exceeds ninety percent of the duration of the first scan line;
the image of the object is not formed using detection signals from a first portion of a second oscillation period that starts at a beginning of the deflecting of the charged particle beam along the third direction, wherein a duration of the first portion of the second oscillation period is greater than zero and less than ten percent of a duration of the second scan line;
the image of the object is formed using detection signals from a second portion of the second oscillation period that extends from an end of the first portion of the second oscillation period to an end of the second oscillation period, wherein a duration of the second portion of the first oscillation period is greater than zero; and
the image of the object is formed using detection signals from a non-oscillation period of the second scan line that extends from the end of the second oscillation period to an end of the second scan line, wherein a duration of the second portion of the second oscillation period plus a duration of the non-oscillation period of the second scan line exceeds ninety percent of the duration of the second scan line.

5. The system of claim 4 wherein the controller is configured to deflect the charged particle beam along the first direction at a first scan rate and deflect the charged particle beam along the third direction at a second scan rate that equals the first scan rate.

6. The system of claim 4 wherein the controller is configured to deflect the charged particle beam along the first direction at a first scan rate and deflect the charged particle beam along the third direction at a second scan rate that differs from the first scan rate.

* * * * *